United States Patent
Kwong et al.

(10) Patent No.: US 7,400,173 B1
(45) Date of Patent: Jul. 15, 2008

(54) DIFFERENTIAL RECEIVER WITH WIDE INPUT COMMON MODE RANGE AND LOW DUTY CYCLE DISTORTION

(75) Inventors: David K. Kwong, Fremont, CA (US); Kuo-Chi Chien, Saratoga, CA (US)

(73) Assignee: Cypress Semicondductor Corp., San Jose, CA (US)

( * ) Notice: Subject to any disclaimer, the term of this patent is extended or adjusted under 35 U.S.C. 154(b) by 692 days.

(21) Appl. No.: 10/923,419

(22) Filed: Aug. 20, 2004

Related U.S. Application Data

(60) Provisional application No. 60/504,185, filed on Sep. 19, 2003.

(51) Int. Cl.
H03K 19/094 (2006.01)
H03K 19/0175 (2006.01)

(52) U.S. Cl. .......................... 326/86; 326/90; 326/115

(58) Field of Classification Search ................ 326/86, 326/90, 115, 126–127
See application file for complete search history.

(56) References Cited

U.S. PATENT DOCUMENTS

| 4,907,121 | A | 3/1990 | Hrassky |
| 5,517,134 | A | 5/1996 | Yaklin |
| 5,703,532 | A | 12/1997 | Shin et al. |
| 5,789,949 | A | 8/1998 | Giordano et al. |
| 5,889,419 | A | 3/1999 | Fischer et al. |
| 6,236,242 | B1 | 5/2001 | Hedberg |
| 6,556,628 | B1 * | 4/2003 | Poulton et al. ............. 375/257 |
| 6,630,847 | B2 | 10/2003 | Hunt |
| 6,639,431 | B1 | 10/2003 | Potter |
| 6,727,756 | B2 | 4/2004 | Mulder et al. |
| 6,975,170 | B2 * | 12/2005 | Lin et al. ..................... 330/258 |

\* cited by examiner

*Primary Examiner*—Anh Q Tran
(74) *Attorney, Agent, or Firm*—Kevin L. Daffer; Daniel McDaniel

(57) ABSTRACT

A transmission system, circuit and method are provided herein for converting differential signals into low duty cycle distortion, single-ended signals that are insensitive to variations in PVT and input common mode voltage. In one embodiment, the signal translation circuit includes an input stage for receiving a pair of differential input signals and producing one or more differential output signals; an intermediate stage for combining the one or more differential output signals into a pair of complementary signals from which a common mode voltage is detected; and an output stage for generating a single-ended output signal that switches from a first value to an opposite value when one of the complementary signals is substantially equal to the common mode voltage.

25 Claims, 6 Drawing Sheets

DIFFERENTIAL RECEIVER WITH WIDE INPUT COMMON MODE RANGE AND LOW DUTY CYCLE DISTORTION

PRIORITY APPLICATION

This application claims priority to Provisional Application No. 60/504,185 entitled "Differential Receiver with Wide Input Common Mode Range and Low Duty Cycle Distortion," filed Sep. 19, 2003.

BACKGROUND OF THE INVENTION

1. Field of the Invention

This invention relates to the transmission of data and, more particularly, to receivers capable of receiving differential input signals and generating low duty cycle distortion, single-ended output signals regardless of variations in PVT (process, voltage and temperature) and input common mode voltage.

2. Description of the Related Art

The following descriptions and examples are not admitted to be prior art by virtue of their inclusion within this section.

The transmission of data involves sending and receiving data over a transmission path, which is connected between a pair of transceivers. Each transceiver can have a receiver and a transmitter (or driver). In this manner, the receiver functions to receive data from the transmission path, whereas the transmitter functions to drive data onto the transmission path. The transfer of data between receiver and transmitter circuits fabricated on separate chips is sometimes referred to as "off-chip" signaling or "chip-to-chip" communication.

Single-ended signals are typically used for on-chip communication because of the reduced area consumption and design complexity generally involved in routing these signals. However, more and more off-chip signals, or signals used for chip-to-chip communication, are routed as differential signals because of their decreased sensitivity to environmental noise. For this reason, numerous transmission protocols such as Low Voltage Differential Signals (LVDS), Stub Series Terminated Logic (SSTL), differential High-Speed Transceiver Logic (HSTL) and Low Voltage Positive Referenced Emitter Coupled Logic (LVPECL) have been established for sending and receiving differential signals across a transmission path. These differential signals often have smaller amplitudes (i.e., reduced swings) to facilitate easier routing in high speed chip-to-chip communications. In addition, the common mode voltage (i.e., the average voltage value) of the differential signals often varies significantly from case to case depending on the actual application environment.

A differential to single-end receiver essentially operates as a differential sense amplifier that can ideally accept a relatively wide input common mode voltage range with a high common mode rejection ratio. However, as with most circuits, a practical sense amplifier has a limit as to the common mode voltage that it can accept. Most conventional sense amplifiers are rated based on the common-mode voltage range they can accept and still remain operational. Thus, many sense amplifiers are rated as either accepting of a relatively high common-mode voltage range or a relatively low common-mode voltage range.

For example, IEEE Std. 1596 is a transmission protocol that utilizes low voltage differential signals (LVDS) which, in some cases, may be as low as 200 mV swing compatible with low voltage MOS, BiCMOS, Bipolar, and GaAs receiver circuitry. The interface standard also specifies a maximum voltage (e.g., approximately 2.4 volts) and a minimum voltage (e.g., approximately 0 volts) of differential signal inputs that are acceptable to LVDS receivers. At relatively low differential swings (e.g., about 200 mV to about 300 mV swing), an LVDS receiver may be rated as one that receives both a high and a low common mode voltage. At somewhat higher differential swings (e.g., greater than about 400 mV), however, the input common mode voltage of the differential signals may extend beyond the optimum operating range of the LVDS receiver. Such large variations in input common mode voltage tend to produce severe duty cycle distortion in the single-ended signal output from the LVDS receiver. In some cases, variations in process, temperature and voltage (PVT) may also adversely affect the output duty cycle.

In general, the "duty cycle" of a signal may be described as the ratio of high time (i.e., the time over which the signal is high) to the overall period of the signal. Though duty cycle specifications are often application-specific, desirable duty cycle values may range between about ±2-5% of 50%. In some cases, "duty cycle distortion" may occur when there are time delay differences between: (i) the rising edges of the input and output signals, (ii) the falling edges of the input and output signals, (iii) the rising edge of the input signal and the falling edge of the output signal, or (iv) the falling edge of the input signal and the rising edge of the output signal. In particular, duty cycle distortion may occur between (i) and (ii) if the output signal is not inverted, and between (iii) and (iv) if the output is inverted. In some cases, duty cycle distortion ("DCD") may be further described as the difference between the output duty cycle (e.g., Y %) and the input duty cycle (e.g., X %), or (Y-X) %. Acceptable levels of duty cycle distortion may range between about 0% DCD and about 10% DCD, depending on the application.

Consequently, a need exists for an improved differential-to-single-ended receiver capable of receiving differential signals over a full range of input common mode voltages and generating low duty cycle distortion, single-ended signals that are insensitive to variations in PVT and input common mode voltage.

SUMMARY OF THE INVENTION

The problems outlined above may be in large part addressed by an improved transmission system, receiver and method for converting differential signals into low duty cycle distortion, single-ended signals, which are insensitive to variations in PVT and input common mode voltage. A receiver is provided, in one embodiment, with an input stage, an intermediate stage and an output stage.

In one embodiment, the input stage may be coupled for receiving a pair of differential input signals and producing one or more differential output signals. In some cases, the pair of differential input signals may include an input common mode voltage ($V_{ICMV}$) included within a range of voltages encompassing a ground voltage ($V_{SS}$) and a power supply voltage ($V_{DD}$). In other words, the input stage may accept differential input signals having input common mode voltages within a range of approximately $V_{SS}$ to $V_{DD}$.

To achieve such an input range, the input stage may actually include multiple input stages. In some cases, the input stage may include a first differential input stage coupled in parallel to a second differential input stage. In such a case, one, the other, or both of the first and second differential input stages may be configured to produce the differential output signals, dependent on whether $V_{ICMV}$ is within a relatively high range, a relatively low range, or a relatively mid-level range, respectively. Though specific ranges may depend on several factors (including, e.g., optimum receiver operating ranges for certain process technologies, or transmission protocol suitable for specific application environments), a "relatively high" range may include at least the power supply voltage, a "relatively low" range may include at least the ground voltage, and a "relatively mid-level" range may include a range of voltages substantially less than the power supply voltage and greater than the ground voltage.

In one embodiment, the intermediate stage may be coupled for combining the one or more differential output signals into a pair of complementary signals from which a common mode voltage may be detected. More specifically, the intermediate stage may include a pair of amplification circuits having a voltage divider circuit coupled therebetween for tracking the common mode voltage of the pair of complementary signals produced by the amplification circuits. The common mode voltage and one of the pair of complementary signals may then be supplied to an output stage, which in some embodiments, may be coupled for generating a single-ended output signal that switches from a first value to an opposite value when one of the complementary signals is substantially equal to the common mode voltage.

In one embodiment, the output stage may include a first comparator circuit, which may be coupled for receiving the common mode voltage and one of the pair of complementary signals from the intermediate stage. The first comparator circuit may be configured for generating the single-ended output signal. For example, by receiving the common mode voltage, the first comparator circuit may be configured for ensuring that an output duty cycle of the single-ended output signal is substantially equal to a duty cycle of the pair of complementary signals generated in the intermediate stage. By preserving the input duty cycle, the output stage is able to maintain timing margins that could have been degraded by duty cycle distortion in the signal path. The output stage also functions to avoid excessive duty cycle distortion, which could render a down-stream receiver in-operable, since most receivers require certain minimum or maximum pulse widths to respond correctly. Avoiding duty cycle distortion may also increase the operating frequency of the signal path, thereby improving the speed by which the output stage may operate.

In a more specific embodiment, the voltage divider circuit of the intermediate stage may include a pair of serially-coupled loads and a node arranged therebetween from which the common mode voltage is detected. The pair of serially-coupled loads may be active or passive, as desired. In some cases, the pair of serially-coupled loads may be given substantially equal impedance values for attenuating the pair of complementary signals by a substantially equal amount. This may allow the intermediate stage to detect a true common mode voltage of the pair of complementary signals.

In other cases, the pair of serially-coupled loads may be given substantially unequal impedance values for attenuating the pair of complementary signals by a substantially unequal amount. This would enable the intermediate stage to generate a modified common mode voltage of the pair of complementary signals. Upon receiving the modified common mode voltage, the comparator circuit within the output stage may be alternatively configured for increasing (or decreasing) the output duty cycle of the single-ended output signal above (or below) the duty cycle of the pair of complementary signals.

In some embodiments, a second output stage having a second comparator circuit may be coupled for receiving the common mode voltage and a different one of the pair of complementary signals from the intermediate stage. In such embodiments, the second comparator circuit may be configured for generating a single-ended output signal, which is complementary to the single-ended output signal generated by the first comparator circuit. In this manner, the presently claimed receiver may be configured for converting reduced-swing differential input signals into full-swing (or nearly full-swing) differential output signals. The input duty cycle may be preserved when producing the differential output signals, or the output duty cycle may be programmatically set to a desired value.

A transceiver system is also disclosed herein as including a transmitter, which may be coupled to a transmission path for supplying a pair of differential input signals thereto, and a receiver, which may be coupled to the transmission path for receiving the pair of differential input signals. In some embodiments, the receiver may include a pair of amplification circuits, a voltage divider circuit and a comparator circuit. In general, the amplification circuits may be coupled for amplifying the pair of differential input signals, while the voltage divider circuit may be coupled for detecting a common mode voltage of the pair of amplified differential input signals. In this manner, the comparator circuit may be coupled for generating an output signal that switches from a first value to an opposite value when one of the amplified differential input signals traverses the common mode voltage.

As noted above, the voltage divider circuit may include a pair of serially-coupled loads and a node arranged therebetween from which the common mode voltage is detected. In some cases, the pair of serially-coupled loads may be given substantially equal impedance values for attenuating the pair of amplified differential input signals by a substantially equal amount, thereby enabling the voltage divider circuit to generate the common mode voltage of the pair of amplified differential input signals. Upon receiving the common mode voltage, the comparator circuit may be configured for maintaining a duty cycle of the pair of amplified differential input signals when generating the output signal. In other cases, the pair of serially-coupled loads may be given substantially unequal impedance values for attenuating the pair of amplified differential input signals by a substantially unequal amount, thereby enabling the voltage divider circuit to generate a modified common mode voltage of the pair of amplified differential input signals. Upon receiving the modified common mode voltage, the comparator circuit may be alternatively configured for increasing (or decreasing) the output duty cycle of the output signal above (or below) the duty cycle of the pair of amplified differential input signals.

A method for producing an output signal from a pair of differential input signals is also disclosed herein. In some embodiments, the method may include amplifying the pair of differential input signals to produce a pair of complementary signals; detecting a common mode voltage of the pair of complementary signals; and using the common mode voltage and one of the pair of complementary signals to produce an output signal, which switches from a first state to an opposite state when an edge of the complementary signal traverses the common mode voltage. The steps of detecting and using a common mode voltage may be used, in some embodiments of the invention, to ensure that an output duty cycle of the output signal is substantially equal to a duty cycle of the pair of amplified differential input signals. Instead of detecting a common mode voltage from the pair of complementary signals, the method may alternatively include programmatically setting the output duty cycle of the output signal to a desired value.

BRIEF DESCRIPTION OF THE DRAWINGS

Other objects and advantages of the invention will become apparent upon reading the following detailed description and upon reference to the accompanying drawings in which.

Figure 1:
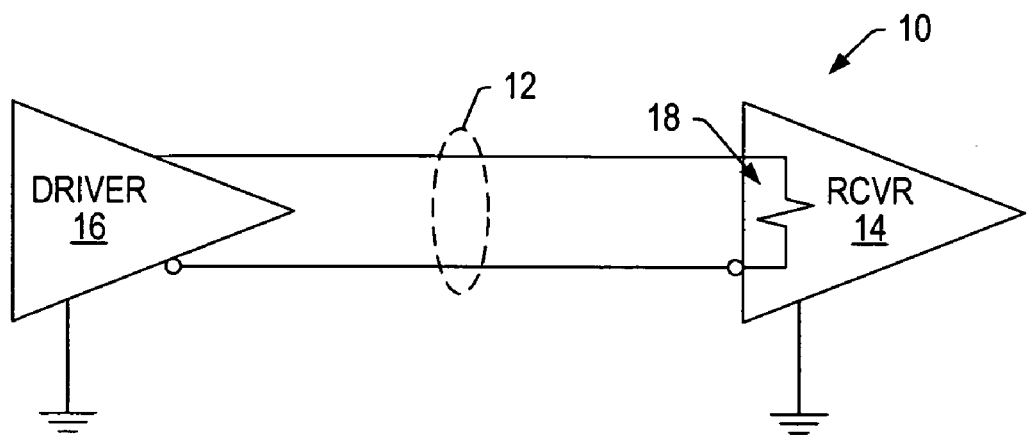
FIG. 1 is a circuit schematic diagram of a differential signal transmission line coupled between a driver and a receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a transmission system 10. System 10 includes a transmission path made up of possibly two lines that are configured to receive differential signals. The opposing ends of transmission path 12 include a pair of interface devices, or transceivers. Though each interface device preferably includes both a receiver and transmitter, transmission system 10 is shown only with the receiver and transmitter (or driver) portions 14 and 16, respectively. Transmitter 16 drives the differential signals across path 12 and receiver 14 senses the voltage differential between those signals.

In general, transmission system 10 may involve any communication system that operates in a low voltage environment and conveys data using differential signaling. If the differential signals are low voltage differential signals (LVDS) specified by the American National Standards Institute (ANSI)/Telecommunications Industry Association (TIA)/Electronic Industries Alliance (EIA) 644 standard, or the IEEE Std. 1596.3 standard, then receiver 14 is configured to accept differential input signals over a range of about 0 volts to about 2.4 volts. It is understood, however, that transmission system 10 is not limited to transmitting only LVDS, and may transmit data according to substantially any differential signal protocol currently known in the art or developed in the future.

Figure 2:
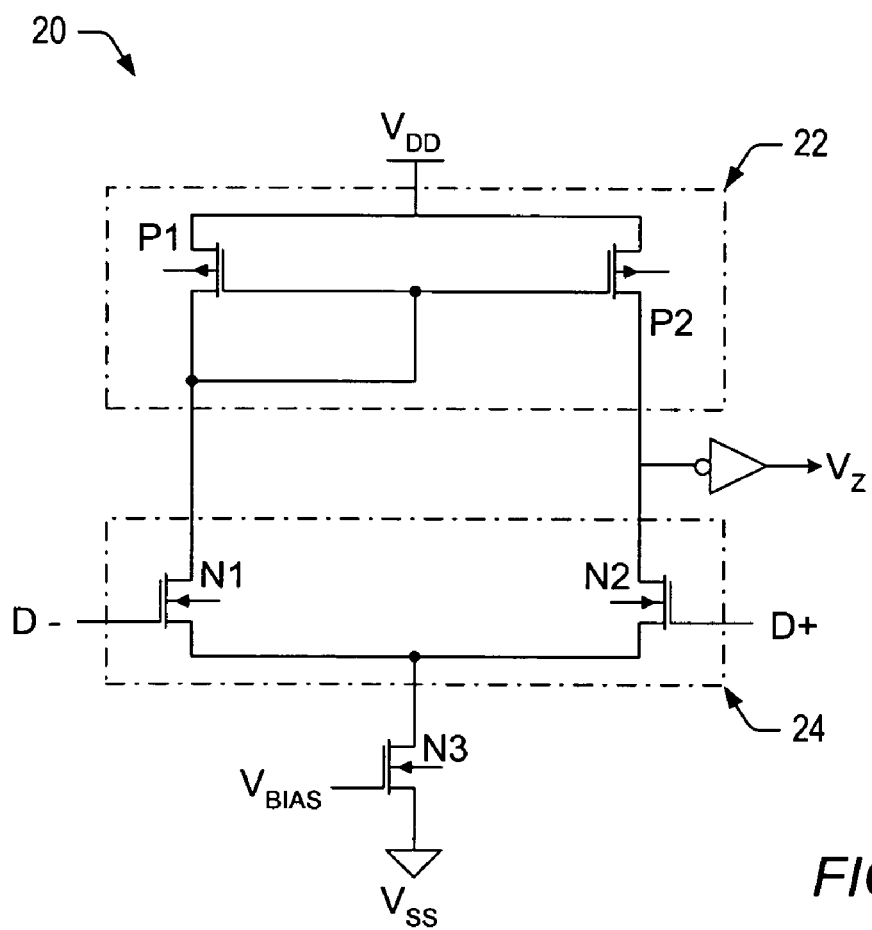
FIG. 2 is a circuit schematic diagram illustrating an exemplary embodiment of the receiver of FIG. 1.

FIG. 2 illustrates one embodiment of a receiver 20 that may be included within transmission system 10. As shown in FIG. 2, receiver 20 includes a current mirror circuit 22 and a differential pair of transistors 24 coupled in series between a power supply voltage ($V_{DD}$) and a ground voltage ($V_{SS}$).

Current mirror circuit 22 consists of a pair of PMOS transistors P1 and P2 coupled in a common-gate configuration. The gate and drain terminals of transistor P1 are tied together to constitute a control current input to the current mirror circuit. The differential pair of transistors 24 includes a pair of NMOS transistors N1 and N2 for receiving a pair of differential signals (D+, D−) at respective gate terminals thereof. NMOS transistor N3, which is coupled between the source terminals of NMOS transistors N1, N2 and $V_{SS}$, is adapted to receive a bias voltage ($V_{BIAS}$) for switching the polarity of the output signal ($V_Z$).

Unfortunately, the receiver embodied by FIG. 2 has many disadvantages, one being the considerably limited range of input common mode voltages ($V_{ICM}$) over which the receiver is able to operate. On the upper end, the operating range of receiver 20 is bounded by a maximum input common mode voltage, $V_{ICM\_MAX}$, of approximately:

$$V_{ICM\_MAX} = V_{DD} - V_{SG1} + V_T \quad (1)$$

where $V_{SG1}$ is the source-to-gate voltage of transistor P1 and $V_T$ is the threshold voltage of the differential pair of transistors N1 and N2. For illustrative purposes, assume $V_{SS}$ is approximately 0 volts, $V_{DD}$ is approximately 5 volts and the transistor turn-on voltage ($V_{TN}$) is approximately 0.85 volts. In such an example, $V_{ICM\_MAX}$ may range between about 2.9 V and about 3.2 V. The operating range of receiver 20 is also bounded, on the lower end, by a minimum input common mode voltage, $V_{ICM\_MIN}$, of approximately:

$$V_{ICM\_MIN} = V_{SS} + V_{DSAT} + V_{GS2} \quad (2)$$

where $V_{DSAT}$ is the voltage needed to place bias transistor N3 in the saturation region and $V_{GS2}$ is the gate-to-source voltage of transistor N1. Continuing with the above assumptions, $V_{ICM\_MIN}$ may range between about 1.2 V and about 1.5 V. As such, the receiver of FIG. 2 is undesirably limited to an operating range of $V_{ICM\_MIN}$ to $V_{ICM\_MAX}$, and therefore, cannot successfully operate over a full range of input common mode voltages extending, e.g., between approximately $V_{SS}$ and $V_{DD}$.

As another disadvantage, receiver 20 often requires relatively large input signal amplitudes (e.g., about 200 mV to about 300 mV) for switching the polarity of the single-ended output signal ($V_Z$). Since the duty cycle of the output signal is highly dependent on the input signal amplitudes, receiver 20 also suffers from severe duty cycle distortion when the input common mode voltage of a particular input signal extends beyond the operating range of the receiver. Such distortion may be unacceptable at extreme input common mode voltages (e.g., in the vicinity of $V_{SS}$ or $V_{DD}$). The output duty cycle of receiver 20 is also adversely affected by variations in process, temperature and voltage (PVT). For example, variations in PVT may alter the receiver switch point, which in turn, may cause changes (on the order of about 10-20%) in the output duty cycle.

Figure 3:
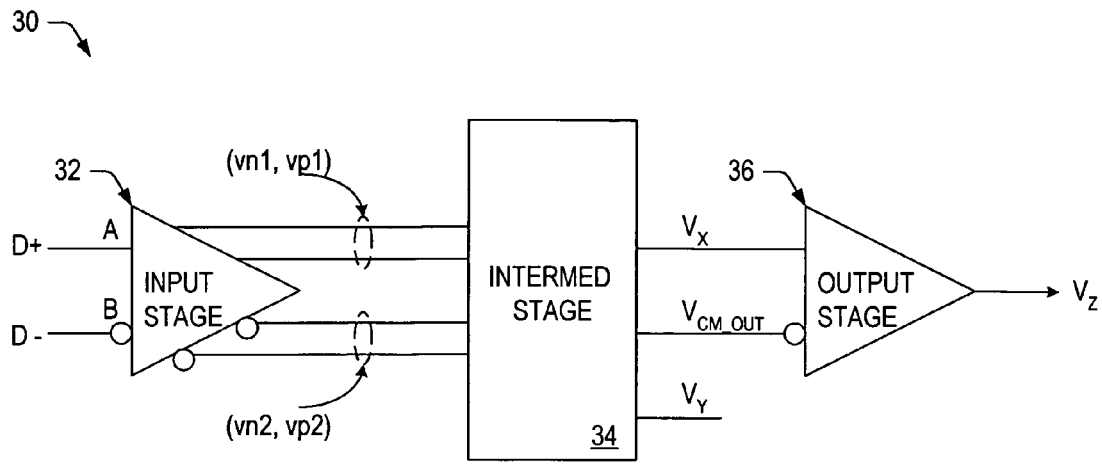
FIG. 3 is a block diagram illustrating a preferred embodiment of the receiver of FIG. 1 as including an input stage, an intermediate stage and an output stage.

FIG. 3 is a block diagram of an improved differential-to-single-ended receiver 30, according to one embodiment of the invention. In some embodiments, receiver 30 is capable of detecting reduced swing differential input signals (e.g., as low as 100 mV) having substantially any common mode voltage within a full-range of available voltages. In other words, receiver 30 is configured to operate over a range of input common mode voltages extending between, and including, the ground supply ($V_{SS}$) and power supply ($V_{DD}$) voltages coupled to the receiver. Receiver 30 may even accept input common mode voltages, which are substantially less than $V_{SS}$ or greater than $V_{DD}$, as long as they do not exceed the technological limit. Receiver 30 is not limited to detecting only reduced swing differential input signals, however, and may be further capable of detecting input signals with amplitudes ranging between approximately 100 mV and $V_{DD}$.

As shown in FIG. 3, receiver 30 is a multiple stage device including input stage 32, intermediate stage 34 and output stage 36. Input stage 32 is essentially a differential-in to differential-out circuit with rail-to-rail (or greater) input common mode range. More specifically, input stage 32 includes two input terminals (A,B) for receiving a pair of differential input signals (D+, D−) from an upstream driver circuit (not shown). Upon detecting the differential input signals, input stage 32 is configured to output one or more differential output signals (vn1, vn2, vp1, vp2) depending on the input common mode voltage of the input signals. As noted above, D+ and D− may be differential signals of substantially any amplitude (or swing) and input common mode voltage.

Intermediate stage 34 receives the one or more differential output signals from input stage 32 and produces a pair of complimentary signals $V_X$ and $V_Y$. In some cases, the differential output signals may be amplified to produce the (nearly full-rail) Vx and $V_Y$ signals. The intermediate stage also includes a voltage divider circuit, which is connected across the complementary outputs for tracking the common mode voltage ($V_{CM\_OUT}$) of those outputs. In this manner, an accurate common mode voltage of:

$$V_{CM\_OUT}=[V_X-V_Y]/2 \quad (3)$$

can be provided to the output stage, regardless of any fluctuation in the complementary signals ($V_X$ and $V_Y$).

Output stage 36 uses the tracked common mode voltage ($V_{CM\_OUT}$) and one of the complementary signals (e.g., $V_X$) to produce a full-rail, single-ended output signal ($V_Z$). A slightly less than full-rail signal may be generated, if desired (e.g., by omitting the inverting element shown in FIG. 8). More specifically, output stage 36 uses the common mode voltage as a reference voltage, or trip-point, for switching a polarity of the single-ended output signal at points where the complementary signal traverses the reference voltage. As used herein, a comparator "trip point" may be described as a threshold level, above which the comparator output assumes a first state, and below which the comparator output assumes a second state, which is substantially opposite to the first state. By maintaining the output stage trip-point at the true mid-point (i.e., common mode) of the complementary signals, receiver 30 minimizes the amount of pulse skew and duty cycle distortion introduced into the single-ended output signal $V_Z$.

Figure 4:
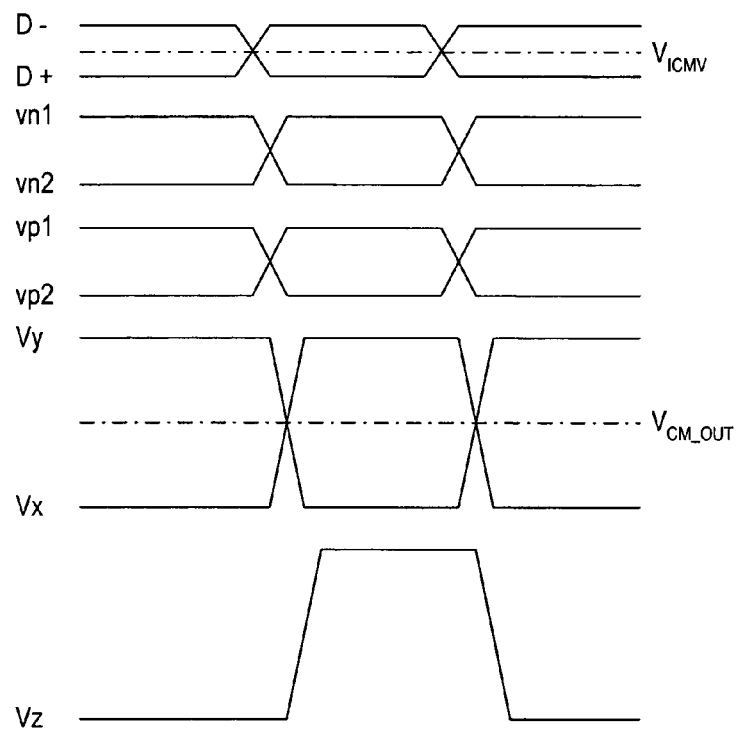
FIG. 4 is a timing diagram illustrating various input and output signals associated with the stages of the receiver of FIG. 3.

Exemplary embodiments of differential-to-single-ended receiver 30 will now be described in reference to FIGS. 4-8. FIG. 4 is a timing diagram illustrating exemplary input and output signals associated with the various stages of receiver 30. Though the exemplary signals of FIG. 4 will be used to illustrate the functionality of each stage, the exemplary signals are not meant to encompass all permutations of possible signals input to or output from each stage. In the same manner, the circuits of FIGS. 5-8 are described below in the context of CMOS technology. It is understood, however, that other technologies, including BiCMOS and bipolar, may be alternatively used in the circuits of FIGS. 5-8.

Figure 5:
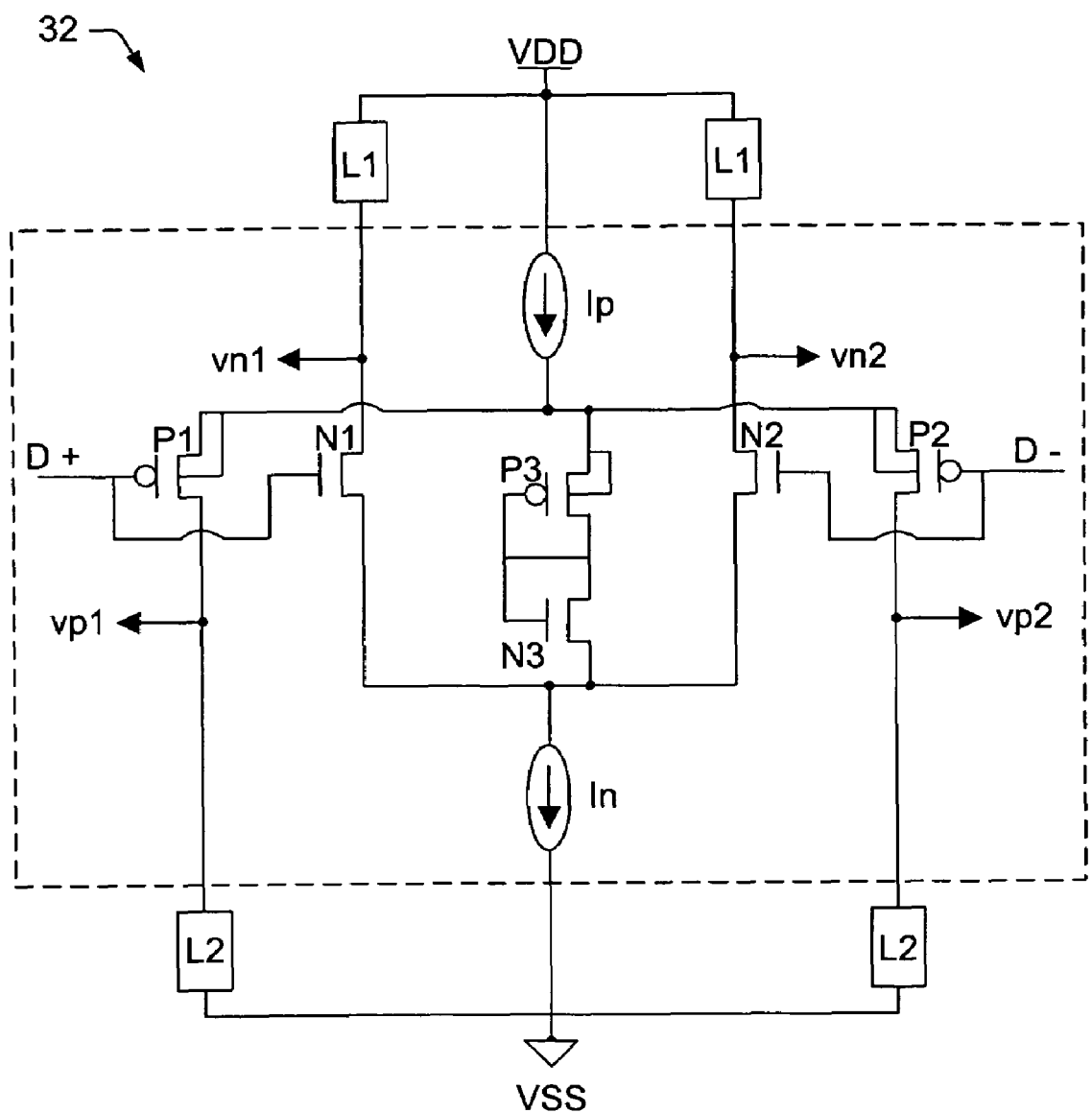
FIG. 5 is a circuit schematic diagram illustrating one embodiment of the input stage within the receiver of FIG. 3.

FIG. 5 illustrates a possible circuit architecture for input stage 32. In general, input stage 32 includes a pair of differential input stages coupled in parallel between power supply ($V_{DD}$) and ground ($V_{SS}$) voltages. More specifically, the first differential input stage may include a pair of PMOS transistors (P1, P2) coupled in a common-source configuration, and a pair of loads (L2) coupled between $V_{SS}$ and the drain terminals of transistors P1 and P2. The pair of loads L2 may comprise either resistive or active elements, but are preferably equal in value. The second differential input stage may also include a pair of NMOS transistors (N1, N2) coupled in a common-source configuration, and a pair of loads (L1) coupled between $V_{DD}$ and the drain terminals of transistors N1 and N2. As before, loads L1 may comprise resistive or active elements of substantially equal value.

In the embodiment of FIG. 5, two current sources (Ip and In) are supplied to the source terminals of the PMOS differential pair (P1, P2) and the NMOS differential pair (N1, N2), respectively. Current sources Ip and In are preferably equal in magnitude. Along with transistors P3 and N3, current sources Ip and In function to minimize any transconductance variation present within the input common mode voltage of the differential input signals (D+ and D−). This helps the output stage to generate an output signal with reduced duty cycle distortion, in which the output duty cycle is substantially equal to the duty cycle of the input signal supplied to the receiver circuit. Alternative means for minimizing the transconductance (gm) variation may be used in other embodiments of the invention. Though such means are not specifically described herein for purposes of brevity, any known technique for designing constant gm input stages may alternatively be used herein.

Figure 6:
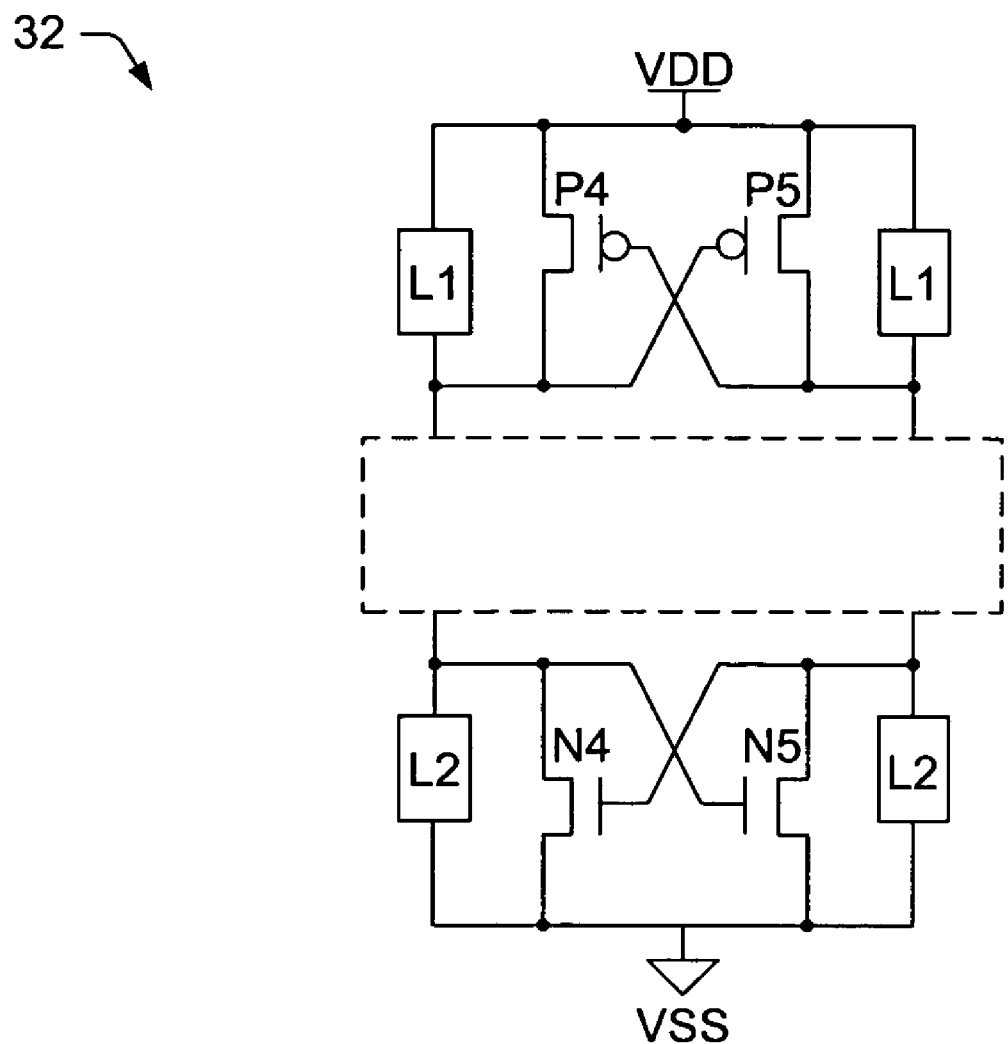
FIG. 6 is a circuit schematic diagram illustrating another embodiment of the input stage within the receiver of FIG. 3.

An alternative circuit architecture for input stage 32 is shown in FIG. 6. In general, a pair of cross-coupled transistors have been added across each pair of "top" and "bottom" loads (i.e., loads L1 and loads L2). In other words, a pair of cross-coupled PMOS transistors (P4 and P5) and a pair of cross-coupled NMOS transistors (N4 and N5) are coupled in parallel across the top pair of loads (L1) and the bottom pair of loads (L2), respectively. The addition of the cross-coupled transistors helps to pull the corresponding pair of loads to either $V_{DD}$ or $V_{SS}$, and therefore, increase the switching speed of the differential output signals (vn1, vn2, vp1, vp2). Circuit elements within the dotted lines of FIG. 6 are identical to those shown within the dotted lines of FIG. 5. Due to increased switching speed, the embodiment of FIG. 6 may be beneficial in high-speed applications, such as high-speed data transmission, amplification and/or buffering circuitry (among others). It is understood, however, that alternative means may be used for increasing the switching speed of the input stage. Such means may include, for example, employing active instead of passive loads, replacing the differential pairs of MOS transistors with higher gain bipolar transistors, etc.

In operation, input stage 32 is configured to produce one or more differential output signals (vn1, vn2, vp1, vp2) upon receiving a pair of differential input signals (D+, D−) at gate terminals of transistors P1, N1 and transistors P2, N2, respectively. However, the number (and/or polarity) of differential output signals produced at any given time is generally dependent on the input common mode voltage of the differential input signals.

In other words, input stage 32 includes two parallel-coupled differential input stages, which are designed to operate within different, partially overlapping, input common mode voltage ranges. Input stage 32 may generate all four differential output signals (vn1, vn2, vp1, vp2) within the overlapping, or mid-level common mode voltage range. However, substantially fewer output signals may be generated when an input common mode voltage falls outside of the mid-level range. For example, only one pair of differential output signals (i.e., vn1,vn2 or vp1,vp2) may be generated when the input common mode voltage exceeds an operating range of either the first or the second differential input stages.

However, input stage 32 is able to accept a full range of input common mode voltages (e.g., from about $V_{SS}$ to about $V_{DD}$) by enabling at least one of the differential input stages to remain operational outside of the mid-level range.

The first differential input stage is adapted to receive and process differential signals having an input common mode voltage within a first range. Since the first differential input stage comprises PMOS transistors (P1, P2), however, it is able to accept input common mode voltages ($V_{ICM}$) within a relatively low range of approximately:

$$V_{SS} < V_{ICM} < [V_{DD} - V_{DSAT} - V_{SGP}] \quad (4)$$

where $V_{DSAT}$ is the saturation voltage of the Ip current source, and $V_{SGP}$ is the source-to-gate voltage of PMOS transistors P1 and P2. Assuming a 5 volt power supply ($V_{DD}$) and an ideal ground potential ($V_{SS}$), the first differential input stage may be configured to accept a relatively low range of input common mode voltages extending between about 0 volts and about 3.8 volts (assuming, e.g., $V_{DSAT}$ is about 0.2 volts and $V_{SGP}$ is about 1.0 volt). However, the relatively low range may extend somewhat beyond the ground potential (e.g., lower than about 0 volts), in some cases.

Likewise, the second differential input stage is adapted to receive and process differential signals having an input common mode voltage within a second range. As noted above, the second range preferably overlaps the first range to some extent. Since the second differential input stage comprises NMOS transistors, however, it is able to accept input common mode voltages within a relatively high range of approximately:

$$[V_{SS} + V_{DSAT} + V_{GSN}] < V_{ICM} < V_{DD} \quad (5)$$

where $V_{DSAT}$ is the saturation voltage of the In current source, and $V_{GSN}$ is the gate-to-source voltage of NMOS transistors N1 and N2. Maintaining the above assumptions, the second differential input stage may be configured to accept a relatively high range of input common mode voltages extending between about 1.2 volts and about 5.0 volts. However, the relatively high range may extend somewhat beyond the power supply voltage (e.g., higher than about 5 volts), in some cases.

Consequently, each of the differential input stages are adapted to operate, to some extent, within a mid-level range of overlapping common mode voltages comprising:

$$[V_{SS} + V_{DSAT} + V_{GSN}] < V_{ICM} < [V_{DD} - V_{DSAT} - V_{SGP}] \quad (6)$$

or between about 1.2 volts and 3.8 volts, in the above example. Therefore, each of the differential input stages produces a pair of differential output signals within the mid-level range. If the input common mode voltage should exceed the mid-level range, however, one of the differential input stages will remain operational for generating a pair of differential output signals.

FIG. 4 illustrates an embodiment in which receiver 30 receives a pair of differential signals (D+, D−) having an input common mode voltage ($V_{ICMV}$) within the mid-level range. With reference to FIGS. 4 and 5, consider the case in which input stage 32 receives a relatively high D+ signal and a relatively low D− signal. In such a case, input stage 32 may generate a relatively high pair of output signals, vn2 and vp2 (where vn2 is high due to transistor N1 being "on" and transistor N2 being "off," vp2 is high due transistor P1 being "off" and P2 being "on"), and similarly, a relatively low pair of output signals, vn1 and vp1 (where vn1 is low due to transistor P2 being "on" and transistor P1 being "off," vp1 is low due to transistor N2 being "off" and transistor N1 being "on").

The opposite would be true for a relatively low D+ signal and a relatively high D− signal. As used herein, the terms "relatively high" and "relatively low" are used for comparison purposes only, and therefore, do not represent particular voltage levels or standard logic levels (though they could, in some cases). The differential output signals are then supplied to intermediate stage 34.

Figure 7:
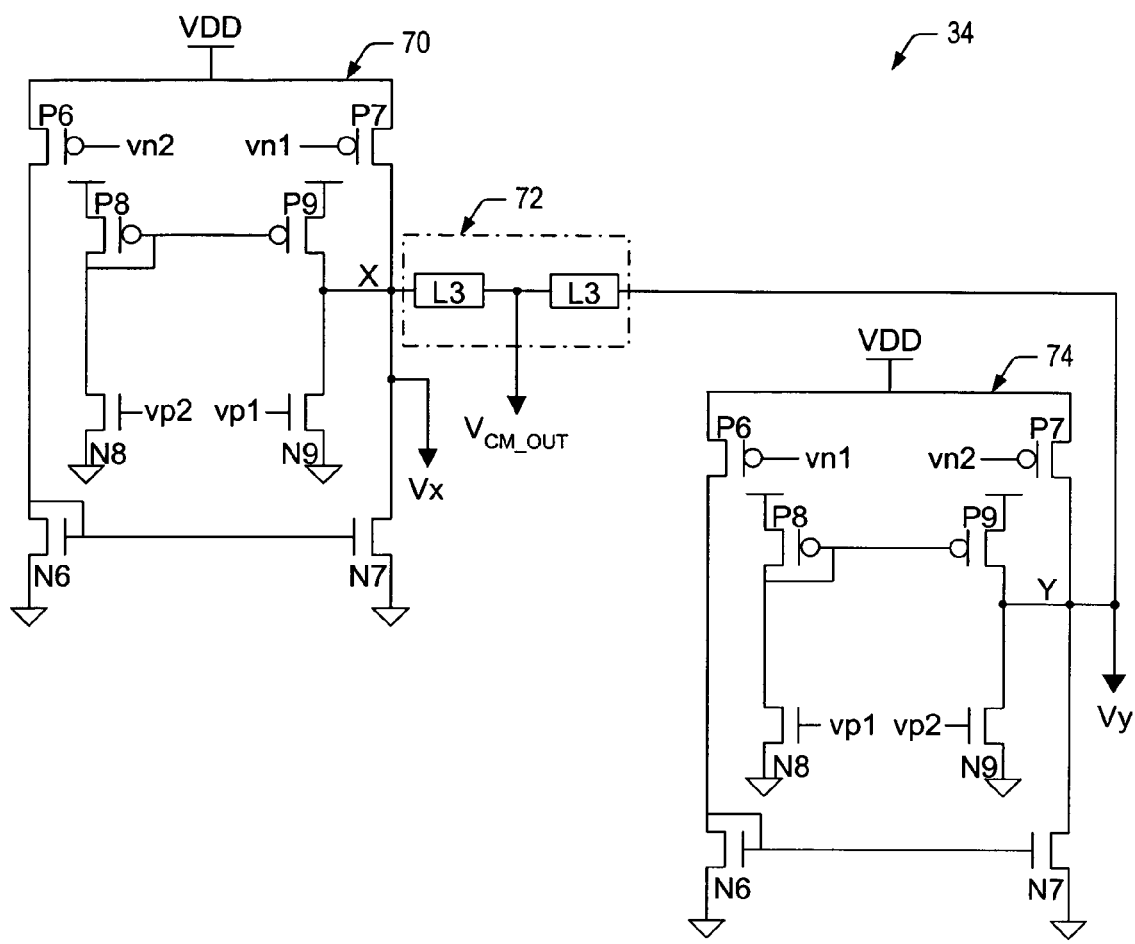
FIG. 7 is a circuit schematic diagram illustrating one embodiment of the intermediate stage within the receiver of FIG. 3.

FIG. 7 illustrates a possible circuit architecture for intermediate stage 34. In general, intermediate stage 34 receives the differential output signals from input stage 32 and generates a pair complimentary outputs ($V_X$ and $V_Y$) by summing the current contributions at node X and the current contributions at node Y. In other words, intermediate stage 34 may be considered to include a pair of amplification circuits 70 and 74 for amplifying the differential output signals (vn1, vn2, vp1, vp2) into nearly full-swing complementary outputs. A voltage divider circuit 72 is also included within intermediate stage 34, and more specifically, coupled between the complementary outputs $V_X$ and $V_Y$ for tracking a common mode voltage ($V_{CM\_OUT}$) of those outputs. Voltage divider circuit 72 contains a pair of loads L3. Loads L3 may comprise resistive or active elements of substantially equal value.

Each of the amplification circuits 70 and 74 includes a pair of PMOS transistors (P6, P7) coupled in parallel between $V_{DD}$ and an NMOS current mirror (N6, N7), and a pair of NMOS transistors (N8, N9) coupled in parallel between a PMOS current mirror (P8, P9) and $V_{SS}$. Depending on the common mode voltage of the input signals, one or more of the differential output signals (vn1, vn2, vp1, vp2) are supplied to the gate terminals of transistors P6, P7, N8 and N9, as shown in FIG. 7, to produce complementary output signals $V_X$ and $V_Y$. For example, all of the differential output signals may be supplied to respective gate terminals of transistors P6, P7, N8 and N9 when the input common mode voltage is within the mid-level range. However, intermediate stage 34 may receive one pair of differential output signals (e.g., vn1, vn2) when the input common mode voltage exceeds the mid-level range, and the other pair of differential output signals (e.g., vp1, vp2) when the input common mode voltage falls below the mid-level range. Regardless of input common mode range, the complementary outputs $V_X$ and $V_Y$ are generated by combining the output node current contributions of the transistors activated by the differential output signals.

With reference to FIGS. 4 and 7, consider the case in which intermediate stage 34 receives all four differential output signals at respective gate terminals of transistors P6, P7, N8 and N9. Assume also that input stage 32 receives a relatively high D+ signal and a relatively low D− signal. In such a case, the voltage ($V_X$) at node X may be substantially equal to the sum of the IR drop through transistors P7 and N8. The voltage ($V_Y$) at node Y may also be equal to the IR drop through transistors P6 and N9. However, the polarity $V_Y$ will be opposite to that of $V_X$, due to current mirroring in circuit 74. On the other hand, if input stage 32 receives a relatively low D+ signal and a relatively high D− signal, $V_Y$ may be substantially equal to the sum of the IR drop through transistors P7 and N8. In this case, current mirroring in circuit 70 produces an equal, though opposite, voltage ($V_X$) at node X.

Though not specifically illustrated in FIG. 4, intermediate stage 34 also produces complementary outputs ($V_X$ and $V_Y$) upon receiving only one pair of differential output signals. If the input common mode voltage exceeds the mid-level range, for example, differential output signals vn1 and vn2 may be supplied to transistors P6 and P7. As such, a voltage ($V_X$) may be produced at node X that is substantially equal to the IR drop through transistor P7 (e.g., if D+ is high and D− is low) or a mirrored version of the IR drop through transistor P6

(e.g., if D+ is low and D− is high). As before, current mirroring in circuit 74 produces an equal, though opposite voltage ($V_Y$) at node Y.

Regardless of input common mode voltage ($V_{ICM}$), the common mode voltage ($V_{CM\_OUT}$) of the complementary signals, $V_X$ and $V_Y$, may be found by taking the mid-point voltage between loads L3, as described above in equation (3). In this manner, a highly accurate common mode voltage may be supplied to output stage 36, along with one of the complementary signals ($V_X$ or $V_Y$).

Figure 8:
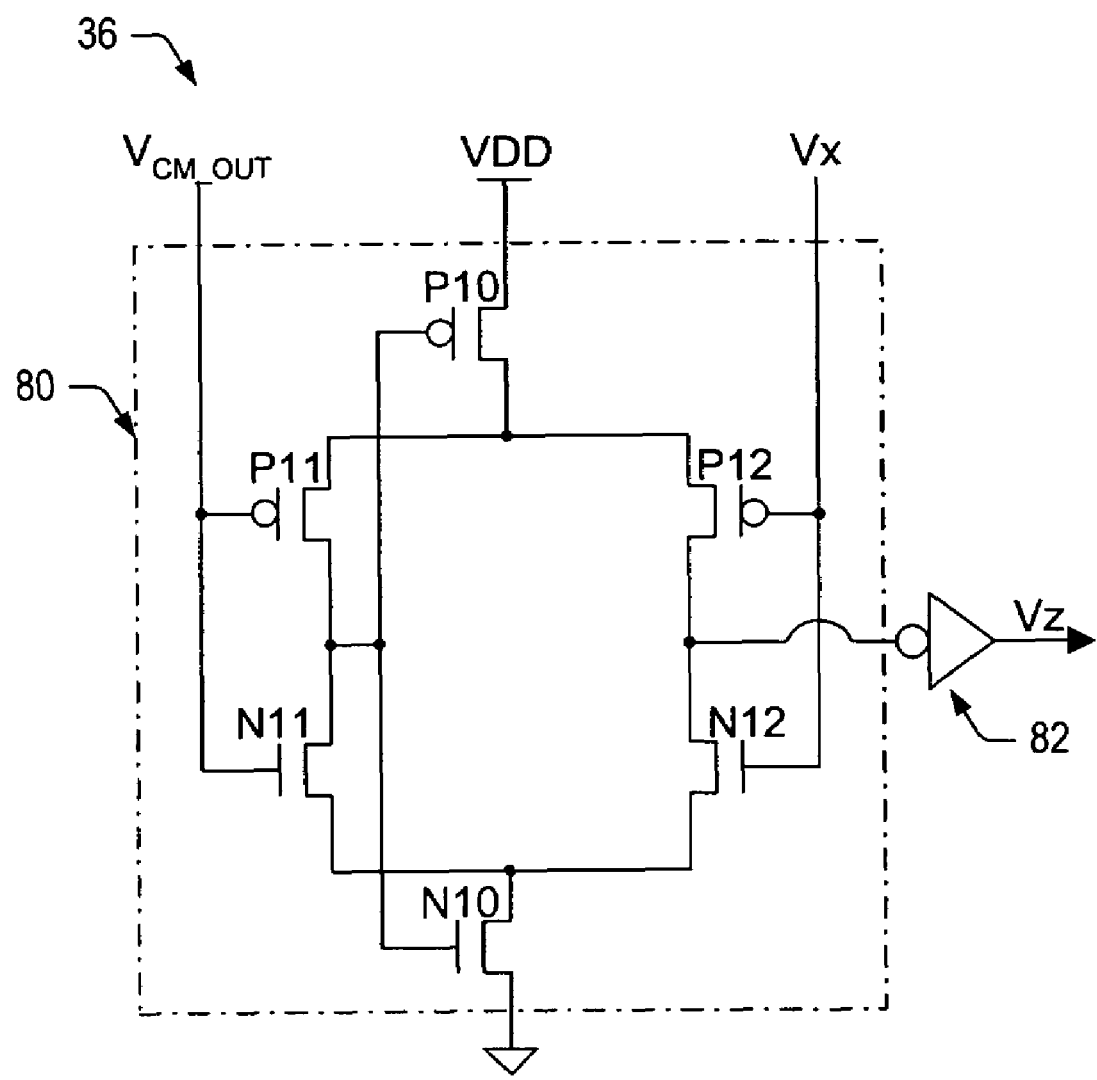
FIG. 8 is a circuit schematic diagram illustrating one embodiment of the output stage within the receiver of FIG. 3.

FIG. 8 illustrates a possible circuit architecture for output stage 36. In general, output stage 36 consists of self-biased comparator 80 and inverting buffer 82. More specifically, comparator 80 may include a first pair of complementary transistors (P11 and N11) coupled in parallel with a second pair of complementary transistors (P12 and N12). The gate terminals of the complementary transistor pairs (P11, N11) and (P12, N12) may be coupled together for receiving the common mode voltage ($V_{CM\_OUT}$) and one of the complementary signals (e.g., $V_X$), respectively. PMOS transistor P10 may be coupled between the power supply voltage ($V_{DD}$) and source terminals of PMOS transistors P11 and P12. Likewise, NMOS transistor N10 may be coupled between the ground voltage ($V_{SS}$) and source terminals of NMOS transistors N11 and N12. The gate terminals of transistors P10 and N10 may be coupled to the drain terminals of cascode transistors P11 and N11.

In the embodiment of FIG. 8, one input of comparator 80 is driven by one of the complementary signals (e.g., $V_X$), while the other input is biased to the common mode voltage ($V_{CM\_OUT}$) of the complementary pair. This allows the single-ended output signal ($V_Z$) to be switched at the common mode voltage of the complementary signals. For example, the common mode voltage may activate each of the transistors P10, P11, N11 and N10. If the complementary signal is relatively high (e.g., greater than the common mode voltage), transistor N12 may also be activated for pulling the output node (OUT) to a substantially low value. The low output node value may then be inverted by inverter 82 to produce a relatively high output signal ($V_Z$). The opposite would be true in the case of a relatively low complementary signal. In some cases, inverter 82 may amplify the output node value to produce a full-rail output signal. In other cases, however, inverter 82 may be omitted to produce a less than full-rail inverted output signal.

Because comparator 80 is biased to a dynamically tracked, and therefore, highly accurate common mode voltage, the comparator trip-point will be maintained at the true mid-point of the output signal, even if the complementary signals fluctuate due to variations in process, temperature, voltage (PVT) and/or input common mode voltage. As a result, the receiver of the present invention can accept differential signals over a full range of input common mode voltages, and generate low duty cycle distortion, single-ended signals that are insensitive to variations in PVT and input common mode voltage. In one embodiment, the receiver may demonstrate a total duty cycle distortion of approximately 1.3% (or lower) across all PVT and full input common mode range. As such, the receiver described herein may be ideal for converting differential signals to single-ended signals when high duty cycle fidelity is a concern (e.g., in high speed communication applications).

A circuit configured for converting a differential input signal into a single-ended output signal with high duty cycle fidelity has been described herein. It is noted, however, that possible circuit configurations and applications should not be limited to the particular configurations and applications described thus far. In some embodiments, alternative means may be used for tracking the common mode voltage in the intermediate stage, instead of the voltage divider circuit shown in FIG. 7 and described above. In some cases, for example, the intermediate stage may include a substantially different current summing circuit with an alternate current mirroring construct (e.g., wide swing cascode current mirrors) for tracking the common mode voltage. In addition, the voltage divider circuit could use active transistors, instead of passive loads, or additional buffering could be added to the output of the divider circuit for driving the output stage. In general, almost any means for generating a voltage reference as a ratio of voltage across $V_X$ and $V_Y$ could be used for tracking the common mode voltage.

In some embodiments, the voltage divider circuit of FIG. 7 (or an alternative version thereof) may be modified for programmatically setting the output duty cycle to a particular value, rather than preserving the input duty cycle as described above. This may be achieved, in some cases, by incorporating additional circuitry and using a different divider ratio within the voltage divider circuit of FIG. 7. In other words, loads L3 may comprise substantially unequal impedance values, so as to attenuate the pair of complementary signals by substantially different amounts. In this manner, a modified common mode voltage may be produced from which the comparator trip point can be set for generating an output duty cycle, which differs from the input duty cycle by a programmatically set amount. The ability to programmatically set the output duty cycle may be desirable for a variety of reasons. Assume, for example, that output stage 36 is to be used for driving another circuit, which tends to narrow it's output duty cycle by about 10% (due, e.g., to design limitations). In this case, the comparator circuit within output stage 36 may be configured to "pre-distort" the duty cycle of the output signal (e.g., by making it 10% wider). In other words, the output stage may be modified to compensate for duty cycle distortion in a downstream circuit, so that the resultant output maintains a desired 50% duty cycle.

Different comparator schemes may also be used in the output stage of the circuit, in some embodiments of the invention. For example, a multi-stage comparator with substantially higher sensitivity and higher speed, or a comparator having a wide common mode input range (similar to the input stage), could be used for comparing one of the complementary signals with the common mode voltage (or a modified version thereof), instead of the comparator circuit shown in FIG. 8. Though the multi-stage comparator may be desirable in applications that require higher speed, it may not be chosen in applications that benefit from reduced power and area. Therefore, the particular comparator scheme chosen may depend on several factors including, but not limited to, operating speed, comparator sensitivity, and the amount of power and area available to the comparator circuit.

In some embodiments, output stage 36 (or an alternative configuration thereof) may be duplicated for converting low swing differential input signals into full-swing differential output signals. For example, a complementary output can be generated by adding another output stage, which is similar to output stage 36, but with $V_{CM\_OUT}$ coupled to the gates of transistors P11 and N11 and $V_Y$ coupled to the gates of transistors P12 and N12. In this manner, the output signal generated by the additional output stage will switch in a direction opposite to $V_Z$. This may be useful for applications in which a non-distorted complementary output is also needed for driving other on-chip or off-chip loads.

It will be appreciated to those skilled in the art having the benefit of this disclosure that this invention is believed to provide an improved differential-to-single-end signal translation circuit that can tolerate input common mode variation (e.g., from approx. $V_{SS}$ to $V_{DD}$), while preserving output duty cycle under PVT and full range of input common mode variation. The signal translation circuit has been described thus far in the context of a transceiver system. As such, the signal translation circuit may be included within, or operationally coupled to, a receiver portion of an on-chip or chip-to-chip transceiver system, in some embodiments of the invention. However, the signal translation circuit should not limited to transceiver circuitry in all embodiments of the invention. In some cases, for example, the signal translation circuit may be included within substantially any device or circuit that benefits from low duty cycle distortion differential-to-single-ended signal translation. As one example, the signal translation circuit may be included within, or operationally coupled to, a voltage control oscillator (VCO) for converting differential output signals of the VCO to a single-ended signal that may be used for driving other on-chip circuits. Alternative uses for the signal translation circuit are possible and within the scope of the invention. In a general aspect, the signal translation circuit may be used for converting on-chip differential logic to off-chip single-ended logic.

Further modifications and alternative embodiments of various aspects of the invention will be apparent to those skilled in the art in view of this description. As noted above, for example, alternate circuit configurations and methods can be used to extend the input common mode range and control transconductance variation in the input stage. Likewise, alternative means may be used for tracking the common mode voltage in the intermediate stage, while different comparator schemes may be used in the output stage. In some embodiments, additional control circuitry may be used to program the output duty cycle, as opposed to preserving it. Therefore, it is intended that the following claims be interpreted to embrace all such modifications and changes and, accordingly, the specification and drawings are to be regarded in an illustrative rather than a restrictive sense.

What is claimed is:

1. A circuit, comprising:
    an input stage coupled for receiving a pair of differential input signals and producing one or more differential output signals;
    an intermediate stage coupled for combining the one or more differential output signals into a pair of complementary signals from which a common mode voltage is detected; and
    an output stage coupled for generating a single-ended output signal that switches from a first value to an opposite value when one of the complementary signals is substantially equal to the common mode voltage.

2. The circuit as recited in claim 1, wherein the pair of differential input signals comprise an input common mode voltage within a range of voltages extending between and encompassing a ground voltage and a power supply voltage.

3. The circuit as recited in claim 2, wherein the input stage comprises a first differential input stage coupled in parallel to a second differential input stage, wherein one, the other, or both of the first and second differential input stages are configured to produce the one or more differential output signals dependent on whether the input common mode voltage is within a relatively high range, a relatively low range, or a relatively mid-level range, respectively.

4. The circuit as recited in claim 3, wherein the relatively high range comprises at least the power supply voltage, wherein the relatively low range comprises at least the ground voltage, and wherein the relatively mid-level range comprises a range of voltages substantially less than the power supply voltage and greater than the ground voltage.

5. The circuit as recited in claim 4, wherein the intermediate stage comprises a pair of amplification circuits and a voltage divider circuit coupled therebetween for detecting the common mode voltage of the pair of complementary signals produced by the amplification circuits.

6. The circuit as recited in claim 5, wherein each of the amplification circuits comprises a pair of P-channel transistors coupled in parallel between the power supply voltage and an N-channel current mirror, and a pair of N-channel transistors coupled in parallel between a P-channel current mirror and the ground voltage.

7. The circuit as recited in claim 6, wherein each of the amplification circuits is configured to receive the one or more differential output signals at: 1) gate terminals of the pair of P-channel transistors when the input common mode voltage is within the relatively high range, 2) gate terminals of the pair of N-channel transistors when the input common mode voltage is within the relatively low range, and 3) gate terminals of the pair of P-channel transistors and the pair of N-channel transistors when the input common mode voltage is within the relatively mid-level range.

8. The circuit as recited in claim 5, wherein the output stage comprises a first comparator circuit coupled for receiving the common mode voltage and one of the pair of complementary signals from the intermediate stage, wherein the first comparator circuit is configured for generating the single-ended output signal.

9. The circuit as recited in claim 8, further comprising a second output stage having a second comparator circuit coupled for receiving the common mode voltage and a different one of the pair of complementary signals from the intermediate stage, wherein the second comparator circuit is configured for generating another single-ended output signal, which is complementary to the single-ended output signal generated by the first comparator circuit.

10. The circuit as recited in claim 8, wherein by receiving the common mode voltage, the first comparator circuit is configured for ensuring that an output duty cycle of the single-ended output signal is substantially equal to a duty cycle of the pair of complementary signals generated in the intermediate stage.

11. The circuit as recited in claim 10, wherein the voltage divider circuit comprises a pair of serially-coupled loads and a node arranged therebetween from which the common mode voltage is detected.

12. The circuit as recited in claim 11, wherein the pair of serially-coupled loads comprise substantially equal impedance values for attenuating the pair of complementary signals by a substantially equal amount, and thereby, generating the common mode voltage of the pair of complementary signals.

13. The circuit as recited in claim 11, wherein the pair of serially-coupled loads comprise substantially unequal impedance values for attenuating the pair of complementary signals by a substantially unequal amount, and thereby, generating a modified common mode voltage of the pair of complementary signals.

14. The circuit as recited in claim 13, wherein by receiving the modified common mode voltage, the first comparator circuit is configured for increasing or decreasing the output duty cycle of the single-ended output signal above or below the duty cycle of the pair of complementary signals, respectively.

15. The circuit as recited in claim 1, wherein the circuit is included within, or operationally coupled to, a receiver portion of an on-chip or chip-to-chip transceiver system.

16. The circuit as recited in claim 1, wherein the circuit is incorporated within a semiconductor chip and configured for converting differential input signals to a single-ended output signal used for driving other on-chip or off-chip circuits.

17. A transceiver system, comprising:
a transmitter coupled to a transmission path for supplying a pair of differential input signals thereto; and
a receiver coupled to the transmission path for receiving the pair of differential input signals, wherein the receiver comprises:
a pair of amplification circuits coupled for amplifying a pair of differential input signals;
a voltage divider circuit coupled for detecting a common mode voltage of the pair of amplified differential input signals; and
a comparator circuit coupled for generating an output signal that switches from a first value to an opposite value when one of the amplified differential input signals traverses the common mode voltage.

18. The transceiver system as recited in claim 17, wherein the voltage divider circuit comprises a pair of serially-coupled loads and a node arranged therebetween from which the common mode voltage is detected.

19. The transceiver system as recited in claim 18, wherein the pair of serially-coupled loads comprise substantially equal impedance values for attenuating the pair of amplified differential input signals by a substantially equal amount, and thereby, generating the common mode voltage of the pair of amplified differential input signals.

20. The transceiver system as recited in claim 19, wherein by receiving the common mode voltage, the comparator circuit is configured for ensuring that an output duty cycle of the output signal is substantially equal to a duty cycle of the pair of amplified differential input signals.

21. The transceiver system as recited in claim 18, wherein the pair of serially-coupled loads comprise substantially unequal impedance values for attenuating the pair of amplified differential input signals by a substantially unequal amount, and thereby, generating a modified common mode voltage of the pair of amplified differential input signals.

22. The transceiver system as recited in claim 21, wherein by receiving the modified common mode voltage, the comparator circuit is configured for increasing or decreasing an output duty cycle of the output signal above or below a duty cycle of the pair of amplified differential input signals, respectively.

23. A method for producing an output signal from a pair of differential input signals, the method comprising:
amplifying the pair of differential input signals to produce a pair of complementary signals;
detecting a common mode voltage of the pair of complementary signals; and
using the common mode voltage and one of the pair of complementary signals to produce an output signal, which switches from a first state to an opposite state when an edge of the complementary signal traverses the common mode voltage.

24. The method as recited in claim 23, wherein the steps of detecting a common mode voltage and using the common mode voltage ensure that an output duty cycle of the output signal is substantially equal to a duty cycle of the pair of amplified differential input signals.

25. The method as recited in claim 23, wherein instead of detecting a common mode voltage from the pair of complementary signals, the method includes programmatically setting an output duty cycle of the output signal to a desired value.

* * * * *